United States Patent [19]
Tietz et al.

[11] Patent Number: 5,848,889
[45] Date of Patent: Dec. 15, 1998

[54] SEMICONDUCTOR WAFER SUPPORT WITH GRADED THERMAL MASS

[75] Inventors: James V. Tietz, Fremont; Benjamin Bierman, Milpitas; David S. Ballance, Cupertino, all of Calif.

[73] Assignee: Applied Materials Inc., Santa Clara, Calif.

[21] Appl. No.: 685,493

[22] Filed: Jul. 24, 1996

[51] Int. Cl.⁶ .................................................. F27D 5/00
[52] U.S. Cl. ..................... 432/258; 432/241; 432/253; 432/259; 392/418
[58] Field of Search .................................. 432/241, 253, 432/258, 259; 219/390, 405, 411; 392/416, 418, 724; 118/725

[56] References Cited

U.S. PATENT DOCUMENTS

| | | | |
|---|---|---|---|
| 4,770,630 | 9/1988 | Akimoto et al. | 432/121 |
| 5,316,472 | 5/1994 | Niino et al. | 432/241 |
| 5,431,561 | 7/1995 | Yamabe et al. | 432/253 |
| 5,443,382 | 8/1995 | Tsurumi et al. | 432/59 |
| 5,482,559 | 1/1996 | Imai et al. | 432/241 |
| 5,556,275 | 9/1996 | Sakata et al. | 432/241 |

*Primary Examiner*—Teresa J. Walberg
*Assistant Examiner*—Jiping Lu
*Attorney, Agent, or Firm*—Fish & Richardson P.C.

[57] ABSTRACT

An annular-shaped edge ring support for a semiconductor wafer has an innermost radial portion for supporting the semiconductor wafer and an outermost radial portion contiguous with the inner portion. The inner portion has a graded thermal mass that generally increases with increasing radius.

27 Claims, 3 Drawing Sheets

5,848,889

SEMICONDUCTOR WAFER SUPPORT WITH GRADED THERMAL MASS

BACKGROUND OF THE INVENTION

The invention relates to support structures for semiconductor wafers in rapid thermal processing systems.

Thermal processing systems that are used in semiconductor device fabrication typically include a substrate support structure on which a semiconductor substrate in the form of a disk-shaped wafer is positioned within a process chamber. In some thermal process systems, the support structure includes a thin, annular-shaped edge ring upon which the wafer rests. For processing silicon wafers, the edge ring can be fabricated of materials which match thermal and chemical properties of the wafer, e.g. silicon or silicon coated silicon carbide.

A multi-zone radiant heat source heats an upward-facing surface of the wafer to a selected temperature, which is typically in the range of about 650° C. to 1150° C. In rapid thermal processes, the heating may last only for as little as a few seconds. A chemical vapor process may also accompany the heating.

Thermal gradients in the wafer of as little as 10°–20° C. (and, in some models, as little as 3° C.) can generate strains that can induce defects, e.g. slip dislocations, in the wafer crystal structure. A single slip dislocation can be cause to reject a wafer. Thermal gradients act with other stress-inducing forces in the wafer to generate defects. Some of these other forces, such as those caused by gravity and mechanical defects in the wafer, typically increase with larger wafer sizes.

To minimize the generation of thermally induced defects, the heat source typically includes an array of heating elements that are arranged above the wafer so as to minimize the thermal gradients across the wafer.

A problem arises near the edge of the wafer, where there is an abrupt change in the thermal load due to the presence of the edge ring support. Abrupt changes in thermal loading cannot be entirely compensated for by controlling the energy distribution of the heat source. For example, merely increasing power at the wafer's edge to compensate for the added thermal mass of the edge ring causes an undesirable increase in temperature in a nearby region of the wafer.

However, abrupt changes in thermal loading produced by the edge ring can be reduced somewhat by using thinner edge ring supports. But if they are too thin the edge rings can be easily damaged during fabrication and handling.

SUMMARY OF THE INVENTION

According to the invention, an edge ring support includes an inner portion for supporting a substrate, the inner portion being structured and arranged to have a graded thermal mass that generally increases with distance from an inner edge.

More specifically, a generally annular-shaped edge ring support for a semiconductor wafer during thermal processing includes an inner portion having an upper surface extending from an inner radius to a larger middle radius for supporting the semiconductor wafer, upstanding structure at the middle radius for retaining the semiconductor wafer on the inner portion, and an outer portion contiguous with the inner portion and extending from the middle radius to an outer radius. The inner portion is structured and arranged to have a graded thermal mass that generally increases with increasing radius.

The invention also provides a method for thermal processing a substrate in a thermal process chamber, including the steps of supporting the substrate on an inner portion of an edge ring support within the chamber, the inner portion being structured and arranged to have a graded thermal mass that generally increases with distance from an inner edge, and then heating the substrate.

The method can also include the steps of providing a process gas in the chamber and spinning the edge ring and substrate during the heating step.

The edge ring support having a graded thermal mass, when supporting a substrate, provides a thermal load profile that does not change drastically at the inner edge of the support. The presence of this type of edge ring can be more easily compensated for by adjusting the energy distribution of the heat source. Thermal gradients in the wafer are thereby reduced, inhibiting the formation of defects in the wafer.

BRIEF DESCRIPTION OF THE DRAWING

FIGS. 7 and 8 are plan views of portions of two edge rings. FIG. 9 is a section view of an edge ring.

For convenience of exposition, similar structures shown in different figures will be referred to by the same reference numbers in the following description.

DETAILED DESCRIPTION OF THE INVENTION

Figure 1:
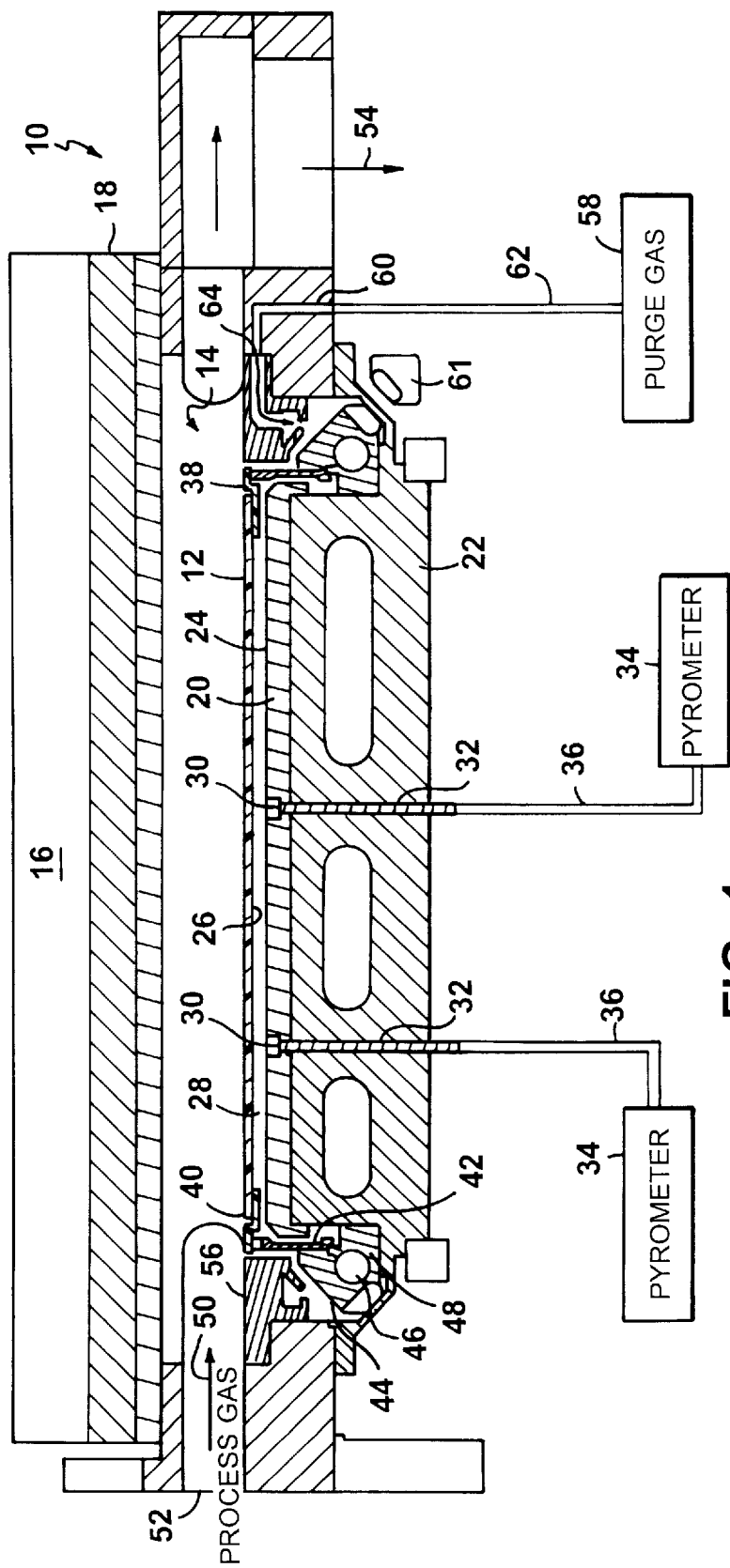
FIG. 1 is a cross sectional view of a thermal process chamber having an edge ring according to the invention.

Referring now to FIG. 1, a rapid thermal processing (RTP) system that has been modified in accordance with the invention includes a processing chamber 10 for processing a wafer-shaped silicon substrate 12. The substrate 12 is mounted inside the chamber 10 on a rotatable substrate support structure 14. A heating system 16 generates radiation which enters the processing chamber 10 through a water-cooled quartz window assembly 18.

The heating system 16 includes an array of individual heat lamps (not shown) arranged in several independently controlled concentric zones to minimize thermal gradients across the substrate 12. Each lamp in the array has a spot size of about 1.2 inches (30 mm). Because of reflections within chamber 10, each lamp makes a contribution to heating the entire substrate 12.

Beneath substrate 12 is a reflector 20 which is mounted on a water-cooled, stainless steel base 22. Reflector 20 is made of aluminum and has a highly reflective surface coating 24. The underside 26 of substrate 12 and the top of reflector 20 form a reflecting cavity for enhancing the effective thermal emissivity of the substrate.

Temperature probes 30 (only two of which are shown in FIG. 1) measure the temperatures at localized regions of substrate 12. The temperature probes are sapphire light pipes that pass through conduits 32 that extend from the backside of base 22 through the top of reflector 20. The probes 30 are coupled via optic fiber cables 36 to pyrometers 34 located outside the chamber 10. Although only two measurement probes 30 are shown in FIG. 1, the embodiment illustrated in FIG. 1 actually uses seven measurement probes distributed at different radii over the reflector 20. During thermal processing, support structure 14 is rotated at about 90 RPM or more. Thus, each probe 30 actually samples the temperature profile of a corresponding annular ring area on the substrate 12.

The support structure 14 that rotates the substrate 12 includes an edge ring 38 that contacts the substrate 12 underneath the substrate's outer edge, thereby leaving almost all of the underside 26 of the substrate 12 exposed except for a small annular region near the substrate's edge 40. Edge ring 38 has a radial width in the illustrated embodiment of approximately 1 inch (25 mm). To minimize the thermal discontinuities that will occur at the edge of substrate 12 during processing, edge ring 38 is made of the same, or similar, material as the substrate, e.g. silicon or silicon carbide coated with silicon or an oxide of silicon. An inner portion of the edge ring 38 that supports the substrate 12 has a thermal mass that is gradually graded down towards its inner edge.

Edge ring 38 rests on a rotatable tubular quartz cylinder 42 that is coated with silicon to render it opaque in the frequency range of the pyrometers 34. The silicon coating on the quartz cylinder 42 acts as a baffle to block out radiation from external sources that might contaminate the intensity measurements. The bottom of the quartz cylinder 42 is held by an annular upper bearing race 44 which rests on a plurality of ball bearings 46 that are, in turn, held within a stationary, annular, lower bearing race 48. The ball bearings 46 are made of steel and coated with silicon nitride (or alternatively, solid silicon nitride) to reduce particulate formation during operation. Upper bearing race 44 is magnetically-coupled to an actuator 61 which rotates cylinder 42, edge ring 38 and substrate 12.

During processing, a process gas 50 is introduced into the space between the substrate 12 and window assembly 18 through an inlet port 52. Gases are exhausted through exhaust port 54, which is coupled to a vacuum pump (not shown).

An optional purge ring 56 is fitted into the chamber body and surrounds the quartz cylinder 42. Purge ring 56 has an internal annular cavity which opens up to a region above upper bearing race 44. The internal cavity is connected to a regulated purge gas supply 58 through a passageway 60 and tubing 62. During process steps that include flowing a process gas into the upper portion of the chamber, a flow of purge gas 64 enters into the chamber through purge ring 56.

Figure 2:
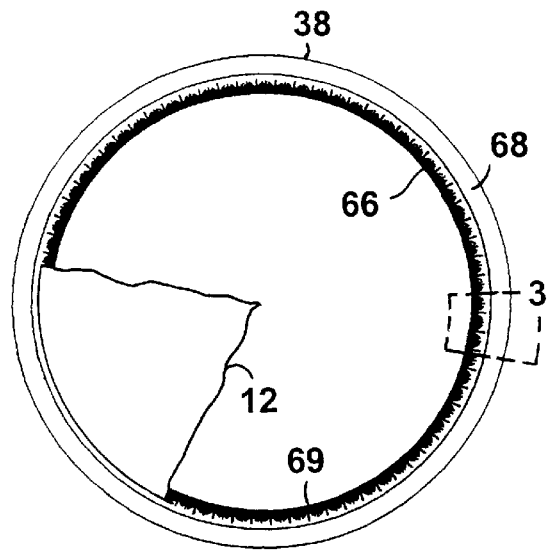
FIG. 2 is a partially broken away, schematic plan view of an edge ring according to the invention supporting a semiconductor substrate.
Figure 3:
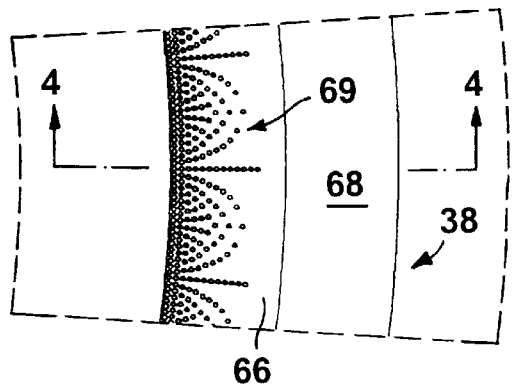
FIG. 3 is a detail from FIG. 2.
Figure 4:
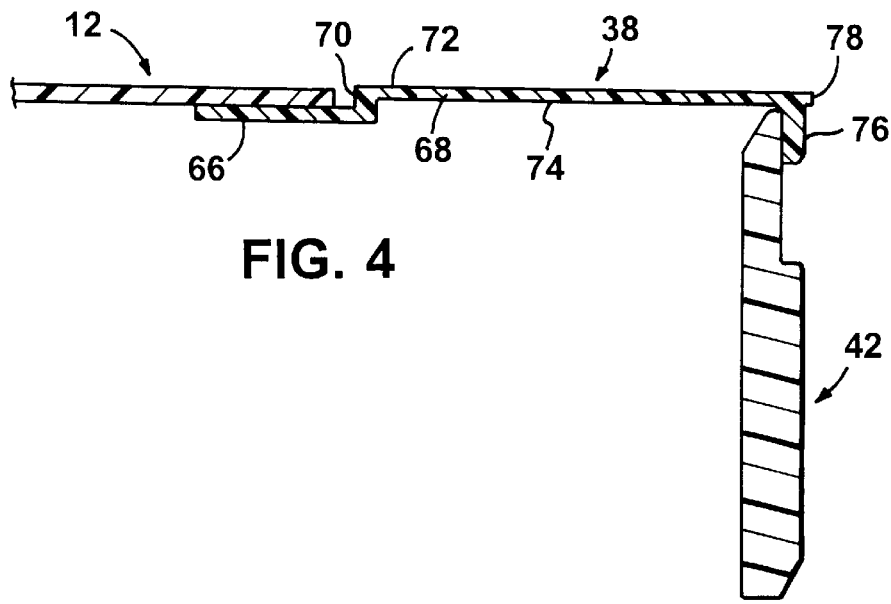
FIG. 4 is a sectional view through lines 4—4 of FIG. 3, not to scale, that also shows the semiconductor substrate and a cylinder supporting the edge ring.

Referring now to FIGS. 2–4, edge ring 38, which is supported by cylinder 42, has an inner portion 66 forming a ledge with an upper surface adapted to support a substrate 12. An outer portion 68 is supported from underneath by cylinder 42. The inner portion 66 in the illustrated embodiment has a uniform thickness of about 0.023 inches (05.75 mm). A pattern of apertures 69 (see FIG. 3) are formed in the inner portion to provide a graded thermal mass that increases with increasing radius. In FIG. 2, the pattern of apertures is too dense near the inner edge of the inner portion to be distinguishable in the illustration, and, in FIG. 4, they are not shown.

The transition between the inner portion 66 and the outer portion 68 forms an inward facing, upstanding surface 70 that keeps substrate 12 centered on edge ring 38 during processing. Upstanding surface 70 in the described embodiment has a diameter approximately 0.126 inches (3.2 mm) larger than the nominal diameter of substrate 12. A typical substrate is approximately 0.03 inches (0.775 mm) thick, plus or minus 0.001 inch (0.025 mm). Upstanding surface 70 is designed to be at least about this high to make sure that substrate 12 does not slip off of edge ring 38 when the support structure and substrate spin. To allow for fabrication tolerances and variations in the thicknesses of different substrates, the illustrated embodiment has an upstanding surface that is about 0.003 inches (0.075 mm) taller than the nominal thickness of the substrate 12. The upstanding surface 70 is not made taller so as not to disrupt the flow of process gasses 50. The outer portion 68 of edge ring 38 in the illustrated embodiment has a flat upper surface 72 that is at the same elevation as the top of upstanding surface 70, also to allow a smooth flow of process gasses 50 across the surface 72.

The ledge formed by inner portion 66 must be broad enough to support the substrate 12 around its entire perimeter to provide a light seal. The ledge has a minimum width of about 0.016–0.032 inches (0.4–0.8 mm) underneath the edge of the substrate 12 to provide support. However, since the diameter of the upstanding surface 70 is larger than the diameter of the substrate 12, and since the diameter of the substrate can vary by plus or minus 0.2 mm, if the ledge is made just this wide then a substrate positioned off-center on the ledge can form a gap between the ledge and one side of the substrate. Light can then leak through the gap into cavity 28. To prevent the formation of such a gap, the inner portion 66 in the described embodiment has a radial width of at least approximately 0.17 inches (4.2 mm).

The support structure 14 is also designed to create a light tight seal between edge ring 38 and quartz cylinder 42. The bottom 74 of edge ring 38, near its outer edge 78, forms an annular-shaped shoulder 76 which has an inside diameter that is slightly larger than the outside diameter of the quartz cylinder 42, so that it fits over the cylinder 42, forming the light seal.

The embodiment of edge ring 38 illustrated in FIGS. 2–4 is formed by grinding a disk of silicon carbide with a diamond grinding head. In the described embodiment, the grinding was done by Morton International, Inc. Exterior corners are fully rounded and interior corners are rounded to a radius of at least approximately 0.01 inches (0.25 mm) to reduce mechanical stresses in the edge ring 38. After the exterior shape of the silicon carbide structure is formed, the apertures 69 are drilled through the inner portion 66, e.g. with a laser. The size of the apertures 69 is determined in large part by the limits of laser drilling silicon carbide. After the apertures are drilled, the entire edge ring 38 is coated with approximately 0.004 inches (0.1 mm) of silicon on each side. The coating can be done by Epitaxy, Inc.

The apertures 69 in the illustrated embodiment extend all the way through inner portion 66 to form through channels. Alternatively, some or all of the apertures 69 may extend only partially through inner portion 66.

The pattern of apertures 69 illustrated in FIGS. 2 and 3 does not extend entirely across the inner portion 66 all the way to the upstanding surface 70, but instead stops a short distance before. Alternatively, the pattern of apertures can extend up to the upstanding surface.

Optimally, the apertures 69 will be patterned such that the thermal mass of the inner portion 66 as a function of radius gradually and gradually (e.g. either linearly or non-linearly) increases from a minimal value at its inner edge to a constant value where the apertures 69 stop near the upstanding surface 70. This can be obtained with a variety of different patterns of apertures. (Note that a key consideration in the thermal grading is that it have a low spatial frequency.)

In the embodiment illustrated in FIGS. 2–4, the pattern of apertures is periodic around the circumference of the edge ring 38. Each period is formed from a series of radially spaced rows of apertures, each row of increasing radius having one aperture less than the preceding row.

Figure 5:
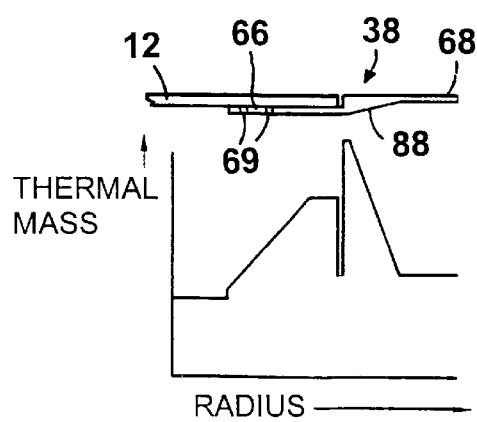
FIG. 5 is a plot of the thermal mass of a wafer and an edge ring that is structured according to the invention with a graded thermal mass, as illustrated in sectional view above the graph, plotted as a function of radius.

The plot in FIG. 5 of apparent thermal mass as a function of radius for a substrate and edge ring 38 according to the invention does not exhibit a large step changes at the inner edge of the edge ring 38. The thermal mass is initially constant where only the wafer 12 contributes to the thermal mass. There is then a small step increase at a radius corresponding to the inner edge of the inner portion 66, then a gradual rise to a radius corresponding to where the thermal grading of the inner portion stops. The thermal mass is constant for a short radial distance until reaching a radius corresponding to the outer edge of the substrate 12, where there is a step decrease. The edge ring thickens at the upstanding surface 70, and there is a corresponding step increase in thermal mass. The outer portion 68 of the edge ring 38 illustrated in FIG. 5 has a thickness that decreases gradually with increasing radius in a section 88 extending from near the upstanding surface 70 to a larger radius.

Figure 6:
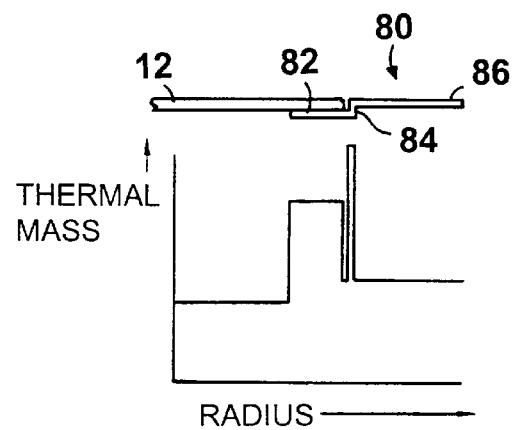
FIG. 6 is a plot similar to FIG. 5, for a wafer and an edge ring according to the prior art.

Referring now to FIG. 6, the apparent thermal mass of a prior art edge ring 80 and silicon wafer 12, plotted as a function of radius, is initially constant where only the wafer 12 contributes to the thermal mass. In contrast to the plot of thermal mass for edge ring 38 shown in FIG. 5, there is a large step increase at a radius corresponding to the inner edge of the edge ring 80. Then the thermal mass is constant again until the peripheral edge of the wafer 12 is reached, where there is a step decrease to an intermediate level corresponding to the thermal mass of the inner portion 82 of edge ring 80. There is an even larger step increase where the edge ring 80 thickens at the juncture 84 between the inner portion 82 and outer portion 86 of edge ring 80, and then a step decrease to about the intermediate level at a radius corresponding to a thinner, constant thickness portion of the outer portion 84 of edge ring.

Note that the inner portion 66 of the edge ring 38 illustrated in FIG. 5 is wider than the inner portion 82 of the prior art edge ring 80 illustrated in FIG. 6. This feature allows a more gradual decrease in thermal mass as a function of radius in this region.

Figure 7:
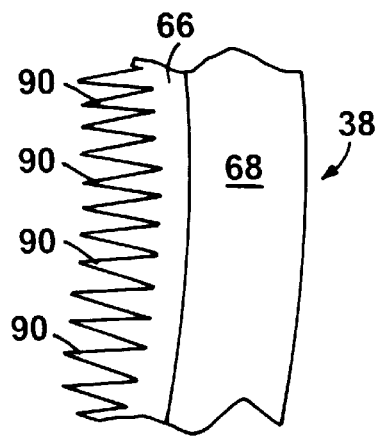
FIGS. 7–9 schematically illustrate other embodiments of the invention.
Figure 8:
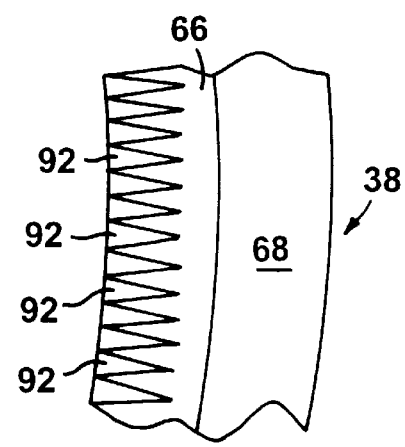
Figure 9:
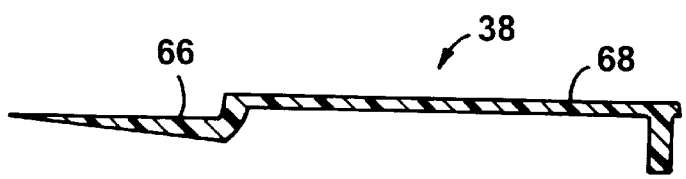

In other embodiments, the graded thermal mass of the inner portion 66 may be provided by a pattern of fingers 90 formed in the inner portion 66 (FIG. 7), by grooves 92 formed in the upper or lower surfaces of inner portion 66 (FIG. 8), by tapering the thickness of inner portion 66 (FIG. 9), or by other types of shaping or patterning of the inner portion 66.

Figure 10:
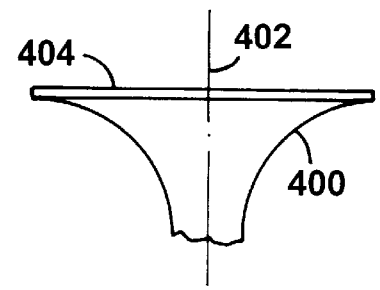
FIG. 10 is yet another embodiment of the invention.

Other embodiments are within the following claims. For example, though we have described the invention in the context of an edge ring support, it could also be used for other wafer support or platform designs. FIG. 10 shows another embodiment in which the thermal mass of the perimeter of the platform 400 decreases in an outwardly radial direction from the center axis 402 of the platform. In this embodiment, the wafer 404 rests on the platform 400 so that its axis is aligned with the axis 402 of the platform and so that the thermal mass of the underlying platform decreases in the outwardly radial direction.

What is claimed is:

1. A thermal apparatus for processing a substrate comprising:
   an edge ring support which supports an outer periphery of the substrate and which has an open center region, said edge ring support including an inner portion that surrounds the open center region and on which the outer periphery of the substrate rests during operation, the inner portion having a graded thermal mass that increases with outward radial distance from an inner edge; and
   a heat source positioned directly opposite the open central region of the edge ring support so as to radiate heat energy directly onto a surface of the substrate during operation.

2. The apparatus of claim 1, wherein the graded thermal mass is formed at least in part by a plurality of apertures in the inner portion.

3. The apparatus of claim 2, wherein the edge ring has a central axis and the plurality of apertures extend in a direction that is parallel to the central axis.

4. The apparatus of claim 2, wherein at least some of the plurality of apertures extend through the inner portion.

5. The apparatus of claim 2, wherein the plurality of apertures are characterized by a density that decreases with increasing outward radial distance from the inner edge.

6. The apparatus of claim 1, wherein the inner portion comprises a plurality of inwardly extending tapered fingers.

7. The apparatus of claim 1, wherein the graded thermal mass is formed at least in part by a plurality of grooves formed in the inner portion.

8. The apparatus of claim 1, wherein the inner portion has a tapered thickness which increases with outward radial distance from the inner edge.

9. The apparatus of claim 1, wherein the graded thermal mass increases linearly with increasing distance from the inner edge to a position between the inner edge and an outer periphery of the inner portion.

10. The apparatus of claim 1, wherein the edge ring support further has an outer portion contiguous with the inner portion and extending outward therefrom to an outer peripheral edge.

11. The apparatus of claim 10, wherein the outer portion of the edge ring support has a region in which thermal mass decreases with outward radial distance.

12. The apparatus of claim 11, wherein the outer portion has a region in which thickness decreases with outward radial distance.

13. The apparatus of claim 1, wherein the edge ring support further has an upstanding structure at a transition between the inner portion and the outer portion for retaining the substrate on the inner portion.

14. The apparatus of claim 13, wherein the upstanding structure comprises an inward-facing, upstanding surface having a height that is about at least as great as the nominal thickness of the substrate.

15. The apparatus of claim 1, wherein the edge ring support comprises silicon carbide.

16. The apparatus of claim 15, wherein the edge ring support comprises an outer layer comprising at least one of silicon and an oxide of silicon.

17. The apparatus of claim 1, wherein the edge ring support comprises silicon.

18. A thermal apparatus for processing a substrate comprising:
   an annular edge ring support on which the substrate rests during operation including an inner portion extending from a first radius to a larger second radius in which thermal mass increases with increasing radius, an inward-facing, upstanding surface at the second radius for retaining the substrate, and an outer portion contiguous with the inner portion, the outer portion extending outward from the second radius; and a heat source positioned directly opposite the open central region of the edge ring support so as to radiate heat energy directly onto a surface of the substrate during operation.

19. The apparatus of claim 18, wherein the thermal mass increases linearly with increasing radius in a range between the first and the second radii.

20. The apparatus of claim 18, wherein the outer portion has a region of decreasing thickness with increasing radius.

21. The apparatus of claim 18, wherein the edge ring support comprises at least one of silicon and silicon carbide.

22. The apparatus of claim 18, wherein the edge ring support comprises an outer layer comprising at least one of silicon and an oxide of silicon.

23. The apparatus of claim 18, wherein the inner portion has a plurality of apertures extending in an axial direction to the edge ring support, the plurality of apertures being arranged with a density of apertures that decreases with increasing radius.

24. A method for thermal processing a substrate in a thermal process chamber, comprising the steps of:

supporting the substrate on an inner portion of an edge ring within the chamber, the inner portion having a graded thermal mass that increases with an outward radial distance from an inner edge;

positioning a heat source directly opposite the edge ring; and radiating energy from a heat source onto a surface of the substrate to heat the substrate.

25. The method of claim 24, further comprising the step of providing a process gas in the chamber.

26. The method of claim 25 further comprising performing the radiating energy and the providing the process gas steps at the same time.

27. The method of claim 24, further comprising rotating the edge ring support and the substrate about a central axis during the radiating step.

* * * * *